United States Patent [19]

Stucki

[11] Patent Number: 4,897,649

[45] Date of Patent: Jan. 30, 1990

[54] KEYBOARD FOR DATA ENTRY ON CONTROL PURPOSES

[76] Inventor: Larry R. Stucki, 1536 N. 1350 West, Provo, Utah 84604

[21] Appl. No.: 937,091

[22] Filed: Dec. 2, 1986

[51] Int. Cl.[4] .................. H03M 11/00; H03K 17/965
[52] U.S. Cl. ...................................... 341/22; 341/20; 200/DIG. 2; 400/492
[58] Field of Search ............ 340/365 S, 365 R, 365 L, 340/365 C, ; 400/489, 492, 479, 479.1, 479.2; 200/332, 335, 52 R, DIG. 2, 277; 341/22, 20, 26, 32, 33; 178/17 C

[56] References Cited

U.S. PATENT DOCUMENTS

| | | | |
|---|---|---|---|
| 2,547,765 | 4/1951 | Lund | 200/335 |
| 3,141,075 | 7/1964 | Brevick et al. | 200/332 |
| 3,198,925 | 8/1965 | Starrantino | 200/332 |
| 3,945,482 | 3/1976 | Einbinder . | |
| 4,081,068 | 3/1978 | Zapp | 340/365 L |
| 4,244,659 | 1/1981 | Malt . | |
| 4,310,254 | 1/1982 | D'Angiollo et al. . | |
| 4,597,681 | 7/1986 | Hodges | 400/492 |

FOREIGN PATENT DOCUMENTS

| | | | |
|---|---|---|---|
| 8300308 | 2/1983 | European Pat. Off. | 400/682 |
| 2376480 | 7/1978 | France . | |
| 62-19923 | 1/1987 | Japan . | |
| 2133745 | 8/1984 | United Kingdom | 400/489 |

OTHER PUBLICATIONS

*Cognitive Aspects of Skilled Typewriting*, William E. Cooper, 1983 Ed., Chapter 13, Certain Problems Associated with the Design of Input Keyboards for Japanese Writing, by Hisao Yamada, pp. 305–407 May 1983.
*Journal of Information Processing*, vol. 2, No. 4, Feb. 1980, A Historical Study of Typewriters and Type Methods: from the Position of Planning Japanese Writing, by Hisao Yamada, pp. 175–202.
*Scientific American*, Feb. 1984, The Skill of Typing, by Timothy A. Salthouse, pp. 128–135.
Psychology Today, Mar. 1984, The Typist's Touch, by Donald R. Gentner and Donald A. Norman, pp. 66–72.
"Speed Keyboard for Data Processor", Hymes et al., IBM Tech. Discl. Bul.; pp. 838; 1980.
"Smart Key" IBM Tech. Discl. Bul.; pp. 1859; Oct 1985.
"Semi-Capacitive Keyboard" by Kowalski; Xerox Disclosure Journal; pp. 85, vol. 1, No. 2, Feb. 1976.
"Digital X Typewritter Keyboard" by D. L. Conway; IBM Tech. Disclosure Bulletin; vol. 18, No. 12, May 1976.

*Primary Examiner*—Palmer C. DeMeo
*Assistant Examiner*—Tyrone Queen
*Attorney, Agent, or Firm*—Robert R. Mallinckrodt; Philip A. Mallinckrodt

[57] ABSTRACT

A keyboard for data entry or control purposes includes a plurality of sets of two or more keys arranged for receving the tips of the finger of a hand of an operator, the keys of each set have such a small superficial touch area and are clustered together so as to be substantially comprehended and selectively operated by a single finger tip of an operator. Additional keys having their superficial touch area spaced from but sufficiently close to the superficial touch area of a set of the sets may be provided to be conveniently operable by a finger tip of user operating the keys of the adjacent set. In a preferred embodiment of the invention, the superficial touch area of each key takes the form of a roller and each set of keys is made up of two keys. In some embodiments, the relative spacing between sets of keys or between keys may be adjustable.

22 Claims, 5 Drawing Sheets

KEYBOARD FOR DATA ENTRY ON CONTROL PURPOSES

BACKGROUND OF THE INVENTION

1. Field

The invention is in the field of keyboards used for typewriters, computers, or the like for data entry or other control purposes.

2. State of the Art

It has long been recognized that the traditional "universal" (qwerty) typewriter keyboard has many defects in terms of the ease of learning and of the accuracy and efficiency of data entry. In fact, according to most historians, this particular arrangement of letters and control keys was deliberately designed to help prevent the jamming of the typebars in early mechanical typewriters by placing the most commonly used letters far apart from each other in the typebasket. It has further been suggested that the letters for the word "typewriter" were all deliberately put in the top row to make it easy for a salesman to quickly type out the name of this new machine while demonstrating its abilities to skeptical clients.

Also, certain basic ergonomic principles that would have maximized workstation productivity and accuracy while minimizing operator fatigue were not taken into account in the design of the universal keyboard; instead, basic mechanical requirements of the early machines usually overruled any conflicting human engineering considerations. Unfortunately, this particular keyboard design became the universal standard before the advent of touch typing for which it is particularly unsuited since:

1. More of the commonly used letters are on the top row than on the home row where the fingers normally rest.
2. Some of the most frequent stroking actions must be done by the weakest fingers.
3. The left hand executes more strokes and completes more complex finger movements than the right hand even though most users are right-handed.
4. The straight horizontal rows of keys interface poorly with human arms, hands, and fingers resulting in unnecessary operator stress and fatigue.
5. The head must be constantly turned to the left or right to read the material being typed, thereby increasing the chance of making errors and of operator fatigue.
6. The staggering of keys on adjacent horizontal rows requires more complex hand-finger movement than if the keys had been also aligned vertically.

As Yamada in his very comprehensive papers, "A Historical Study of Typewriters and Type Methods: from the Position of Planning Japanese Parallels" (*Journal of Information Processing*, Vol. 2, No. 4, pp. 175–202, February 1980) and "Certain Problems Associated with the Design of Input Keyboards for Japanese Writing" in *Cognitive Aspects of Skilled Typewriting*, William E. Cooper, 1983 ed., pp. 305–407, clearly demonstrates and as I have discovered in a search of issued patents and of the literature, inventors beginning at least in the year 1870 became aware of these problems and have tried to correct these deficiencies by such means as:

1. Splitting the keyboard into two separate halves.
2. Curving the key rows to fit the hand.
3. Varying the height, location, and/or shape of keys and the keyboard itself to match various characteristics of the different fingers and the hands themselves.
4. Moving shift and other control keys from the weaker to the stronger fingers.
5. Moving the most commonly used letters to the home row.
6. Using the feet to perform shift and control functions.
7. Moving the most commonly used letters to the strongest fingers.
8. Using linguistic and motion study analyses to determine the most efficient placement of keys.
9. Using multiple, simultaneous key strokes to reduce the number of keys required to produce a full set of characters and to reduce the needed finger and hand and/or arm motion needed to produce such characters, for example, the use of the shift key to produce upper and lower case letters.
10. Using finger guides to insure proper location of fingers for touch typing.
11. Moving the most frequently occurring consecutive symbols to different fingers or hands.
12. Providing for the single stroke entry of symbols representing whole syllables.
13. Allowing common two or more letter combinations to be entered by striking the two or more keys simultaneously.
14. Use of a double threshold key to eliminate the need for a shift key.
15. Use of a two or more stroke (in sequence) entry system to simplify the entry of the hundreds or thousands of symbols needed to type a nonphonetic written language.

In reference to recently suggested systems, D'Angiolillo et al. (U.S. Pat. No. 4,310,254) designed a keyboard to provide for the single stroke entry of symbols representing syllables. This provided a more efficient mechanical shorthand device to record court proceedings, etc. Only 33 keys are needed for his machine, rather than the usual 50. However, the shorthand code produced has to be retyped again for a reader not familiar with the code.

Einbinder (U.S. Pat. No. 3,945,482) changed the traditional keyboard to allow common two letter combinations to be entered by striking the two keys simultaneously and tried to arrange the keys to maximize alternate left-hand and right-hand input. However, it would take an operator some time to learn which two letter combinations could be entered in this fashion. For example, if the keys "s" and ∫t" were struck simultaneously, a person must learn if the result will be "st" or "ts". The newly announced "Velotype" keyboard is said to solve this problem through the use of a very fast computer with an enormous memory of the probability of occurance of different letter combinations in varying syntactic contexts, so that the letter combinations for whole syllables can be entered simultaneously in a manner similar to the way in which a piano chord is played. This is a modification of an early suggestion to use a piano-type keyboard. Michael Adler in his 1973 book, *The Writing Machine*, states that such a keyboard should be modified so that certain control actions, such as spacing and shifting from lower to upper case letters, can be done using foot switches. With such a keyboard, Adler suggests that the typist could approach the pianist's "data-entry" speed of over 1,500 to 2,000 strokes a minute (the equivalent of 300–400 words per minute).

Three problems with such a suggestion immediately arise, namely, the large size of such a keyboard, although Cuau (1978 French Patent No. 2,376,480) suggests a way that a more compact piano-type keyboard can be constructed, as do also the developers of the "Velotype" keyboard which uses only 37 keys, the fact that the pianist's greatest speed is usually only achieved by playing memorized materials, a situation that occurs very rarely in ordinary typing behavior, and the difficulty of precisely synchronizing foot and finger movements.

Malt (U.S. Pat. No. 4,244,659) has organized the keys so that in order to provide high speed operation, the most frequently used symbols are operated by the strongest fingers, and the most frequently occurring consecutive symbols are operated by different fingers. A one-handed version is also described. However, in assigning the letters to the strongest fingers, Malt has actually lost much of the potential input speed due to alternating left-hand and right-hand stroking.

The ultimate reduction in number of keys and finger movements away from the home row occurs in Cy Enfield's "Microwriter", first marketed in 1978, which used only six keys to generate the entire alphabet and the most common punctuation marks. A mnemonic system is used to train the operator to know which keys must be pressed simultaneously to generate given characters. However, in spite of the inventor's claim that these combinations of keystrokes are easy to memorize, the lack of visual cues to character generation on the keyboard makes it impossible for the novice to operate. Also, the fact that it is a one-handed keyboard limits the ultimate typing speed that can be achieved, as does also the number of relatively awkward combinations of finger strokes needed to generate certain characters.

The most recent research, as found in the articles "The Skill of Typing" by Timothy A. Salthouse, *Scientific American*, February 1984, pages 128-135, "The Typist's Touch" by Donald A. Norman, *Psychology Today*, March 1984, Pages 66-72, and the above referenced Yamada papers, indicates that, since most skilled touch-typists begin the movement of fingers toward the striking positions as early as seven spaces before the actual key depression occurs, typing speeds slow when:

1. The same finger must be used to produce a two or three letter sequence.
2. More than one key must be depressed at one time (chording, shifting).
3. A key must be visually located because of either infrequent usage or the presence of too many keys on the keyboard.
4. The fingers must make large or awkward jumps on the keyboard away from their home positions.

While many different keyboards have been suggested by the prior art, there remains a need for a keyboard that not only takes into consideration the above factors but provides for increased speed of data entry and ease of use.

SUMMARY OF THE INVENTION

According to the invention, a keyboard for data entry or for control purposes includes a plurality of sets of two or more keys mounted on a base and arranged for receiving the tips of the fingers of a hand of an operator in a home position with respect to the keyboard. The keys of each set have such small superficial touch areas and are clustered together as to be substantially comprehended and selectively operable by a single finger tip of an operator. In one embodiment of the invention, each of the sets of keys is made up of two closely spaced keys having the form of rollers arranged so that a finger tip of the operator will lightly rest on and sense both keys simultaneously and easily depress one or the other of the keys or both simultaneously. Since the fingers rest lightly on the respective sets of keys, so as to comprehend or sense the keys, the hands can be easily placed in correct home position entirely by feel without any visual input. When two keys are used in each set, they are preferably arranged substantially along the longitudinal axis of the finger, so that a rocking motion of the finger will operate the keys, whereas the keys under the thumbs are arranged transversly to the longintudinal axis of the thumb so as to be operated by a lateral movement of the thumb.

The base on which the sets of keys are mounted is adapted to provide substantially separate portions of the keyboard for the right and left hands and is configured so that the base of each hand can rest on the keyboard, with the fingers in normal postion resting lightly on the corresponding sets of keys in home position. This substantially reduces user fatigue.

With the sets of keys as described, and using two keys per set, each finger or thumb can generate three characters in the home position using only two switches. Additional or extra keys to be operated by a small movement of the appropriate thumb or finger away from the home position may be located adjacent to these sets of keys. In such instance, the additional keys have their superficial touch area spaced from but sufficiently close to the superficial touch area of a set of keys so as to be operable by a finger tip operating the adjacent set of keys. With the close spacing or clustering together of the keys of each set and using keys of small superficial touch area, and with relatively close spacing of similar extra keys, each thumb may easily operate as many as four different extra or shift type keys and each outside finger may easily operate as many as three different extra or shift type keys.

For English alpha-numeric data input, such as for typewriters and computers, only twenty-eight keys are necessary to easily produce all needed characters. The twenty-eight keys used in such instances are preferably twenty home row keys plus four shift keys duplicated for each hand to give a total eight extra keys. By using ten shift keys for each hand for a total of twenty shift keys, three shift keys for the index and little finger of each hand and four shift keys for each thumb, in addition to the twenty home position keys, over 20,000 characters can be easily generated, more than enough to type the normally used kanji characters of the Chinese and Japanese languages.

THE DRAWINGS

In the drawings, which illustrate the best mode presently contemplated for carrying out the invention:

FIG. 1 is a top plan view of the keyboard of the invention showing the relative positions of the keys and showing, in broken lines, the hands of a user in home position;

FIG. 2, a vertical section taken on the line 2—2 of FIG. 1;

FIG. 3, a vertical section taken on the line 3—3 of FIG. 1;

FIG. 4, a top plan view of one-half of an embodiment of keyboard showing placement of extra keys;

FIG. 5, a top plan view of one half of an embodiment of keyboard with key placement similar to that of FIG. 1, but showing a separate cursor control;

FIG. 6, a key assignment diagram showing a preferred assignment of alpha and numeric symbols for the keyboard of FIG. 1;

FIG. 7, a vertical section taken on the line 7—7 of FIG. 5;

FIG. 8, a top plan view of the left-hand half of an embodiment of a keyboard with key placement similar to that of FIG. 1, but showing adjustable sets of keys; and FIG. 9, a vertical section taken on the line 9—9 of FIG. 8.

DETAILED DESCRIPTION OF THE ILLUSTRATED EMBODIMENT

Figure 1:
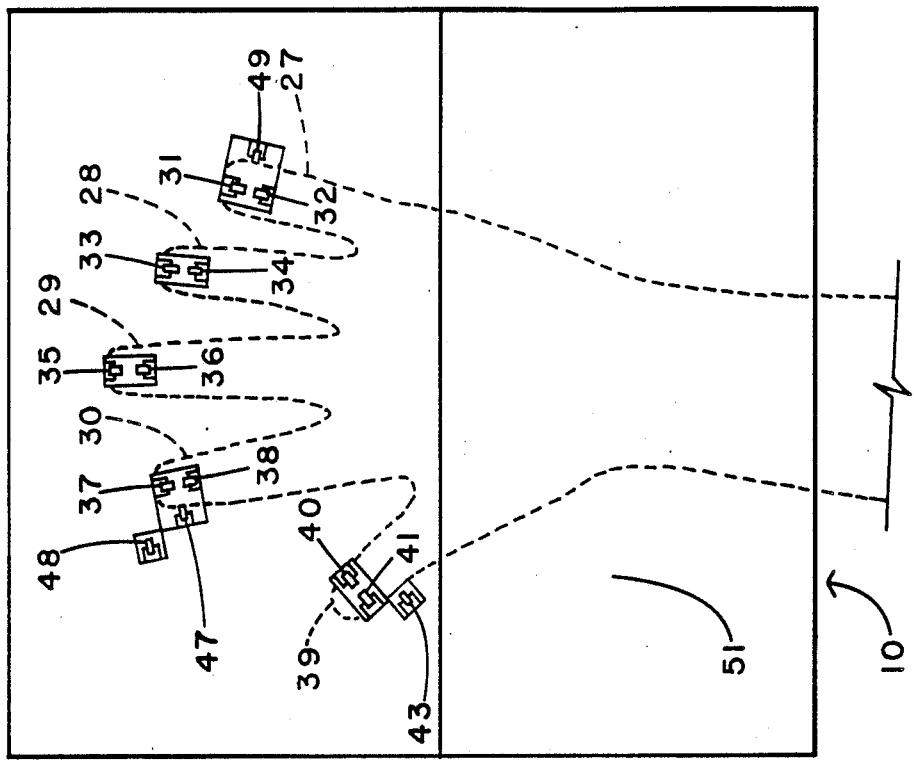
Figure 1:
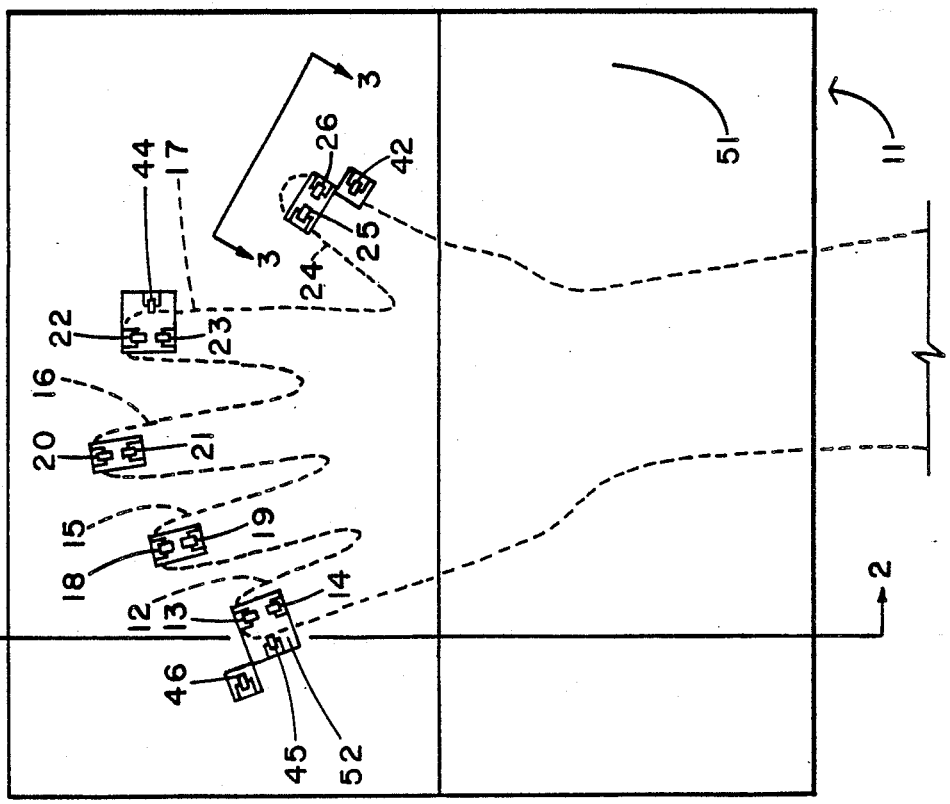

As shown in FIG. 1, the keyboard of the invention has a right-hand section 10 and left-hand section 11. These sections may be completely separate units as shown or may be mounted on a single base unit. Even when mounted on a single base unit, however, it is preferable that each section have some degree of independent adjustment as to spacing between the sections and relative angular placement. Thus, the sections 10 and 11 may be spaced apart and rotated a comfortable amount for a particular user.

Each keyboard section 10 and 11 has a plurality of sets of closely spaced, small superficial touch area keys positioned so that each finger and thumb of a hand in home position will rest lightly on a set of keys and comprehend or sense the individual keys of the set. Thus, as shown in FIG. 1, the left hand of a user is shown in home position by broken lines with little finger 12 resting lightly on clustered keys 13 and 14 forming a set of keys, see also FIG. 2. In like manner, fingers 15, 16 and 17 rest on sets of clustered keys made up of keys 18 and 19, 20 and 21, and 22 and 23, respectively. Thumb 24 rests lightly on a set of keys made up of keys 25 and 26, see also FIG. 3.

In similar manner for the right hand, fingers 27, 28, 29, and 30, when in home position, rest lightly on sets of keys 31 and 32, 33 and 34, 35 and 36, and 37 and 38, respectively. Thumb 39 rests lightly on keys 40 and 41.

As shown in FIG. 1, additional keys 42 and 43 are located adjacent the sets of keys 25 and 26, and 40 and 41, respectively, and can be operated by respective left and right thumbs 24 and 39 by moving such thumbs laterally from home position. In similar manner, additional key 44 is positioned to be operated through a lateral movement of left index finger 17 and additional keys 45 and 46 are positioned to be operated by lateral movements of left little finger 12. Key 46 in the embodiment shown is a lock key and is located farther from the home position of little finger 12 than is key 45 so that, while little finger 12 can easily reach key 45 through a small lateral movement, key 46 is more difficult to reach. Since this key is one that should not be hit by accident, it is located so that it is more difficult to reach. Additional keys 47 and 48 are positioned to be operated by lateral movement of right index finger 30 and key 49 is positioned to be operated by lateral movement of right little finger 27. Again, key 48 in this embodiment is a lock key, not be be hit by accident, so is placed farther away from home position of finger 30 than is key 47 so a deliberate stretching movement of finger 30 is required to depress it.

Figure 2:
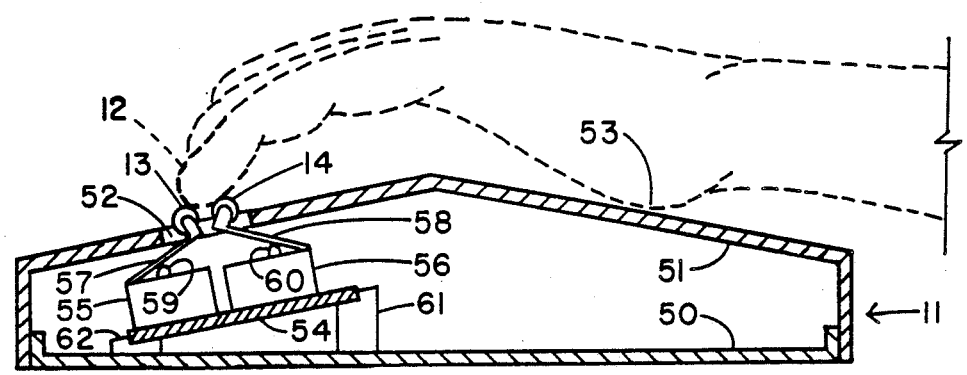
Figure 3:
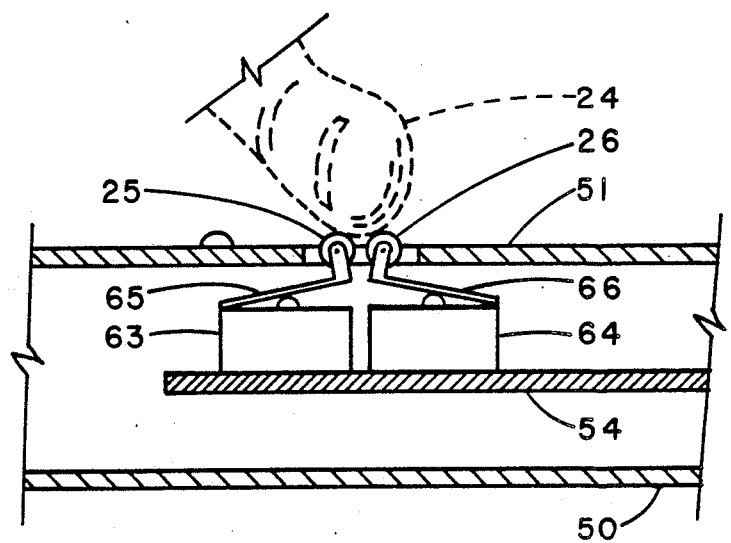

Keyboard sections 10 and 11 are each preferably formed with a base plate 50 as shown for left hand section 11 in FIGS. 2 and 3 and a cover 51 which extends upwardly from base plate 50 along its sides and forms a top cover spaced from base 50 with a compartment therebetween. Cover 51 may be removably secured to base plate 50 in any suitable manner. Cover 51 has openings therein such as 52, FIG. 2, through which the keys such as 13 and 14 extend. As shown in FIGS. 1 and 2, cover 51 is configured so that the heel of the hand can rest upon the cover as at 53, FIG. 2, with the fingers comfortably extending to and resting upon the respective sets of keys.

The keys of each set have a relatively small superficial touch area as compared to currently known typewriter keys and are clustered or spaced relatively close together. Thus, where a finger tip would rest on the top surface of a single key of the currently used typewriter and computer keyboards, with the current invention, having relatively small sized and closely spaced keys, the finger tip rests simultaneously on all of the keys of a set as shown in FIGS. 2 and 3. In this manner, it is easy to locate a hand in home row position without any visual input. Where with the currently used keyboards it is difficult to tell without visual input which row of keys the fingers are on, the two closely spaced keys of the invention provide an indication by feel as to the correct finger positions.

It is preferred that the top surfaces of the keys of the invention be of a nature that the finger can easily slide thereon. Rollers, as shown in the drawings, have been found to work well. As shown, the keys may take the form of commonly available microswitches mounted beneath cover 51 on a mounting board 54 which may take the form of a printed circuit board if the switches are adapted for printed circuit board mounting. This type of mounting is preferred, if possible, because it eliminates electrical wires extending from each switch and where individual sets of keys are fixed relative to one another the printed circuit board may be designed for mounting of all switches of each keyboard section along with the necessary interface circuitry needed to convert the key inputs to the electrical signals indicative of the key input. As shown in FIG. 2, microswitches 55 and 56 are mounted on mounting board 54. The normal switch arms 57 and 58 extend from the switch bodies 55 and 56, respectively, and have rollers forming keys 13 and 14 mounted in normal fashion thereon. The switches are positioned so that rollers 13 and 14 extend through hole 52 in cover 51 and may be depressed by finger 12 to actuate the switches through plungers 59 and 60, respectively, in normal manner. Mounting board 54 is positioned in keyboard section 11 in any suitable manner such as by mounting tabs 61 and 62 molded into base plate 50 if base plate 50 is made of plastic, or stamped into base plate 50 if made of metal. Similarly, as shown in FIG. 3, switches 63 and 64 are mounted on a portion of mounting board 54 which extends under thumb 24, and rollers forming keys 25 and 26 are mounted in normal fashion on arms 65 and 66 respectively.

In use, each set of two keys, such as keys 13 and 14 of FIG. 2, are used to produce three different combinations or characters. As shown in FIG. 2, if finger 12 is rolled forwardly, it will depress key 13 while key 14 remains undepressed. This is one combination and will produce a distinct output signal, i.e. switch 55 closed and switch 56 open. If finger 12 is rolled backwardly, it will depress key 14 while leaving key 13 undepressed and create a second combination of the two keys producing a distinct second output signal, i.e. switch 56 closed and switch 55 open. If finger 12 is pressed downwardly, both keys 13 and 14 are depressed simultaneously creating the third combination of the two keys and a third distinct output signal, i.e. switch 55 and switch 56 simultaneously closed. Each of these three combinations of switch closures can be used to produce a different and distinct character or control signal. Similarly, as shown in FIG. 3, each thumb can press one or the other of the keys, or both keys simultaneously, to produce a closure of one or the other of the switches, or both switches simultaneously by moving the thumb to one side or the other to depress one or the other of the keys, or by depressing the thumb to depress both keys simultaneously.

The individual switches operated by the keys of the keyboard will be connected to interface circuitry, not shown, so that the switch closures produce respective signals representative of the desired character or a control signal represented by the particular key or combination of keys depressed. This interface circuitry will be similar to interface circuitry currently used with electronic keyboards as used in most typewriters and computers, particularly where provision is made to sense the simultaneous closure of two or more switches, and will be well known to any person skilled in the electronic keyboard art. The interface circuitry will, of course, vary depending upon the total number of keys used with the keyboard, the individual assignment of characters or control functions to individual keys, and the specific equipment to be operated by the keyboard such as the specific computer or typewriter being controlled.

Figure 6:
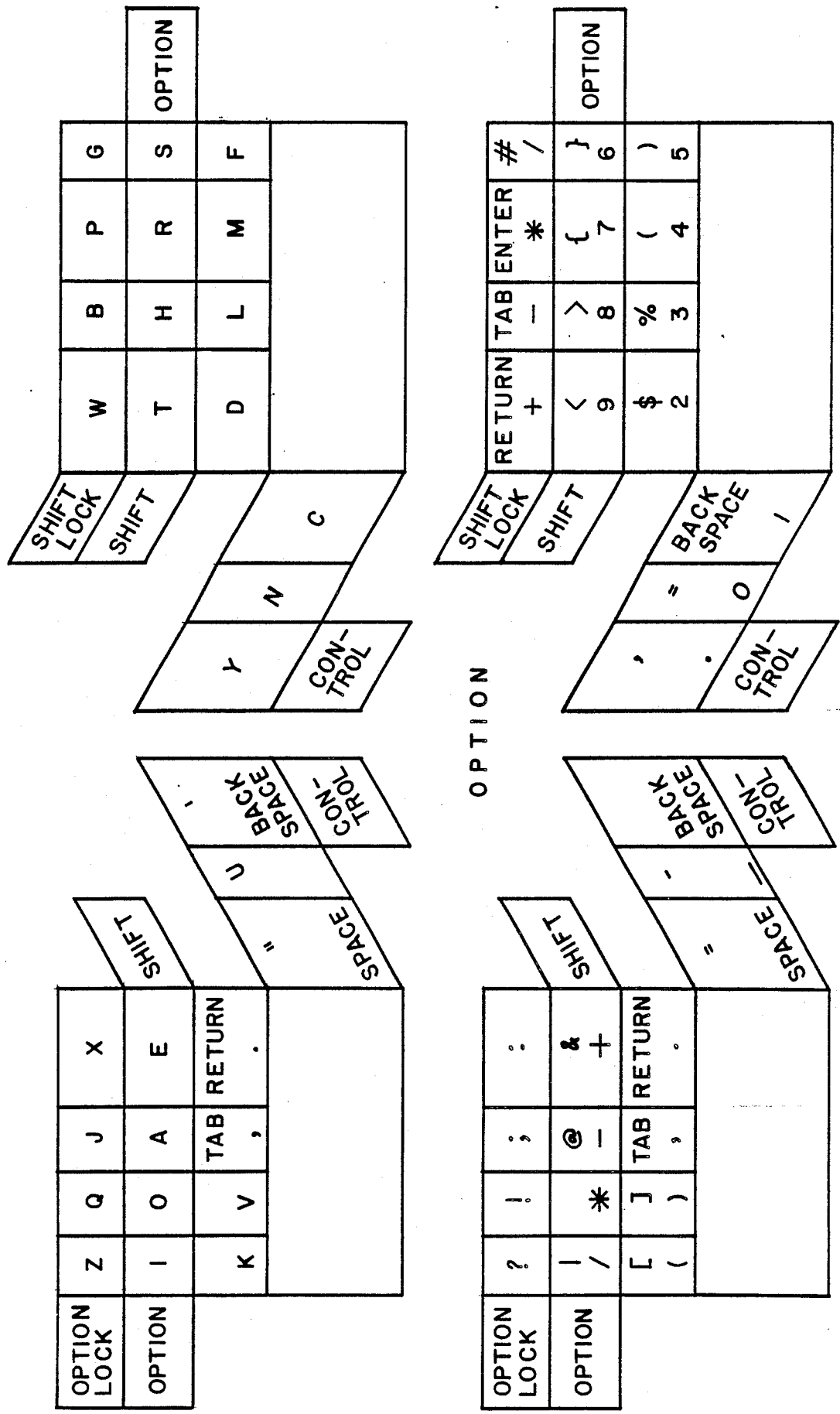

The various key assignments may vary considerably. A currently preferred key assignment for use with computers, word processors, and typewriters in the English language is shown in FIG. 6 where the top portion shows the normal keyboard assignment and the bottom portion shows the keyboard assignment in an option condition. The option condition is merely another assignment of the keys obtained by having the option key depressed at the time the desired key is also depressed. Its operation is similar to option keys currently used on some computer keyboards which function as additional shift keys to access a new set of characters.

Referring to FIG. 6, the top left hand row of the top portion shows the letters "Z", "Q", "J", and "X". These are the letters produced by depressing keys 13, 18, 20 and 22 respectively, FIG. 1. The second row shows the letters "I", "O", "A", and "E". These are the letters produced by depressing keys 13 and 14 simultaneously, 18 and 19 simultaneously, 20 and 21 simultaneously, and 22 and 23 simultaneously, respectively. The bottom row of the upper left hand portion shows the letters "K", "V", symbol ",", and symbol ".". These are the letters or symbols produced by depressing keys 14, 19, 21, and 23 respectively. The letters and symbols produced are lower case letters unless the shift key, 44, is depressed at the same time as the indicated keys to give the capital letters and provide a "tab" and "return" rather than the "," or "." as shown. The angled row having the designations "space", "U", and "back space" correspond to depressing thumb key 25, thumb keys 25 and 26 simultaneously, or thumb key 26, respectively. Again, the """, capital "U", and """ are obtained from the same keys when they are pressed with the shift key also pressed in normal manner. The upper right hand portion of FIG. 6 shows the key assignments for the right hand portion of the keyboard of FIG. 1. Thus, according to the diagram, a "W", "B", "P", or "G" is obtained by depressing key 37, 35, 33, or 31. A "T", "H", "R", or "S" is obtained by depressing keys 37 and 38 simultaneously, 35 and 36 simultaneously, 33 and 34 simultaneously, or 31 and 32 simultaneously. A "D", "L", "M", or "F" is obtained by depressing key 38, 36, 34, or 32. The "Y", "N", or "C" is obtained by pressing thumb key 41, keys 41 and 40 simultaneously, or key 40, respectively. Again, in unshifted condition, these letters would be lower case and in shifted condition, i.e., the desired key is depressed during a time when the shift key is also depressed, would be capital. The shift keys are either key 44 for the left hand or key 47 for the right hand. Key 48 is a shift lock key.

The lower portion of FIG. 6 shows the assignment of the same keys as described for the upper portion of the drawing, but in the option condition. Keys 45 and 49 are the option keys with key 46 being an option lock key. Thus, while key 13 produces a lower case letter "z" in normal, unshifted condition, if key 13 is depressed during a time when the option key is also depressed, a "?" is produced. With the key assignment shown, the "?" is produced in either unshifted option or shifted option condition. If key 14 which produces a "k" in normal unshifted condition is depressed at the same time the option key is depressed, a "(" is produced, as shown in the lower left portion of FIG. 6. If key 14 is depressed at the same time both the option and shift keys are also depressed, a "[" is produced. The other keys function similarly to produce the symbols, numbers, or functions indicated in the lower half of FIG. 6.

The control keys indicated, keys 42 and 43 in FIG. 1, operated by the thumb, serve as additional shift type keys to create additional functions for the various keys and conveniently may operate similarly to the control keys on many computers, such as the various apple computers. The control key used in conjunction with various other keys of the keybord may take the place of the various individual function keys used with various IBM and IBM compatible computers.

With the arrangement shown where each finger and thumb in home position can produce three separate combinations of keys to produce three separate characters, both hands in home position produce thirty separate characters. By depressing the shift key along with with any of the thirty separate characters, an additional thirty separate characters can be produced for a total of sixty separate characters. An additional shift type key, such as the option key, allows a user to produce an additional sixty separate characters for a total of one hundred and twenty separate available characters. An additional key such as the control key, in conjunction with both the shift and option keys again doubles the characters available to two hundred and forty separate characters. Similarly, each additional shift-type key added will double the number of characters that can be produced. This total however, may be limited by the ability of a user to hold down the shift, option, control, or other shift type keys while also pressing the key or keys for the individual character desired. This problem can be alleviated to a large degree by providing duplicate shift type keys on the keyboards for each hand so that one hand can operate and hold down the required shift type keys while the other hand operates the individual keys. For example, referring to FIG. 6, duplicate shift keys, option keys, and control keys are provided for operation by either the left hand or the right hand. The left hand can easily hold down an option key, a shift key, or a control key, or any combination of the three keys while the right hand operates the individual home row keys to provide the desired character. Conversely, the right hand can operate and hold down any combination of shift type keys while the left hand operates the home row keys to produce desired character. Also, in some cases, individual characters may be duplicated, such as, for example, the space and back space functions shown in FIG. 6 which are duplicated in both normal and option conditions. It can thus be seen that by adding additional shift type keys, a very large number of individual characters may be obtained. These additional keys maybe added as desired, in a number of positions for easy access by any of the desired fingers.

Figure 4:
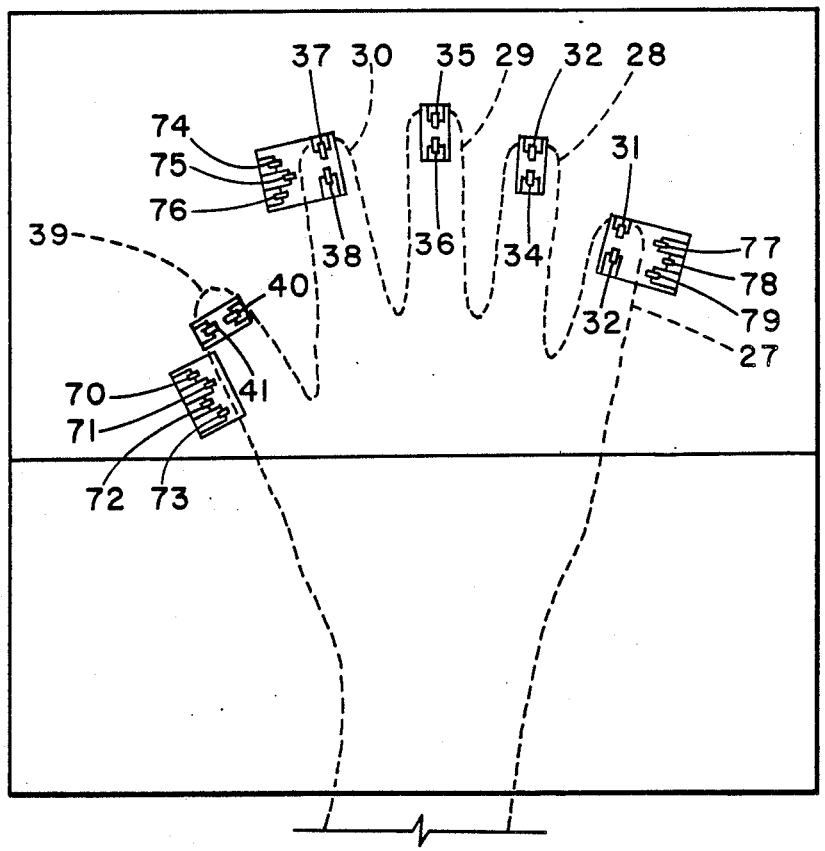

It has been found that the little finger and index finger of each hand can easily operate up to three shift type keys and that each thumb can easily operate up to four shift type keys. FIG. 4 shows such an arrangement with respect to the right hand keyboard section with the fingers and home row keys numbered similarly to FIG. 1, but showing a preferred arrangement of additional shift type keys. The left hand keyboard section would be similarly but oppositely arranged. As shown, additional keys 70, 71, 72 and 73 are provided for operation by thumb 39, keys 74, 75, and 76 are provided for operation by index finger 30, and keys 77, 78, and 79 are provided for operation by little finger 27. This arrangement provides three shift type keys for the little finger, three shift type keys for the index finger and four shift type keys for the thumb. Although a small number of combinations of the four keys used with the thumb are difficult to operate, the combination of four keys that can be easily operated by the thumb are more than the total combination that can be produced with three keys. Such an arrangement provides ten shift type keys for each hand. If all the shift type keys are duplicated for each hand, the arrangement of FIG. 4 produces a total of ten different shift type keys. With the thirty home row keys, the ten shift type keys result in a total number of different characters which can be produced of $2^{10} \times 30$ or 30,720. Since, as mentioned above, a small number of the combinations of the four thumb operated shift type keys cannot be easily generated, the total number of characters which can be easily generated will be somewhat less than the 30,720 calculated, but will still be over 20,000 individual characters. This provides more than enough character capacity to type the most commonly used Kanji characters of the Chinese and Japanese languages making typewritters practical for use with such languages. Further, studies show that only about 4,000 Kanji characters are necessary for most Japanese and Chinese writing. By using various word processing programs being developed for use with phonetic and roman letter equivalents of languages such as Japanese and Chinese, the number of characters necessary for a keyboard will be nomore and in many cases less, than required for the English language, and, in such case, the keyboard of FIG. 1 can be used or the additional keys, such as shown in FIG. 4, may be used, but the additional keys rather than being shift type keys can function as selection keys to select between several Kanjis or other characters that may be generated for a particular phonetic input.

The keyboard of the invention is not only advantageous where a large number of characters are needed, but, since combinations of keys produce characters as well as individual keys, the invention can reduce the total number of keys needed over the current standard keyboards. In the embodiment discussed where two keys are used to produce three separate characters, only about two-thirds the number of keys are needed to generate the same number of characters as would be needed where each character was assigned its own individual key. The invention is useful in all situations in which a keyboard could be used. If a program is used where the characters are built using multiple keystrokes, such as the Chang Chieh method which builds up Chinese characters using six keystrokes, with the present invention the six keystrokes needed could be generated with only two sets of two switches, i.e. four keys, where six keys are needed with a conventional keyboard.

The particular English letter and symbol assignments as shown in FIG. 6 for the keyboard of FIG. 1, have been made in an attempt to optimize a keyboard for English language typing. Most of the vowels, the common punctuation marks, and the least used consonants have been placed on the left to maximize the number of letter sequences that can be produced by the very efficient overlapping of alternate right and left hand strokes. The most common two letter combintions are assigned to different fingers to increase the speed of keystroke entry by overlapping of the coordinated movements of two or more different fingers. The few less common two letter combinations that are operated consecutively by a single finger are easily produced by a simple small finger movement which, because of the rollers, can be made smoothly and very quickly. While the attempt has been made to optimize the assignment of letters in the configuration as shown in FIG. 6, additional studies may show that other arrangements may be desirable. Also, as indicated, all numbers and symbols needed for numerical data entry are placed on the right hand portion for one handed entry of numerical data. While this does not give the advantage of alternating hand strokes, such one handed entry is currently usually preferred by users.

With any key assignments as shown in FIG. 6, the keys themselves will generally not be marked but a chart showing the assignments, such as that of FIG. 6, will be positioned for reference, if necessary, by the typist, or the chart could be displayed either constantly, or when needed, on the screen of the word processor or computer with which the keyboard is used or on a separate display.

Figure 7:
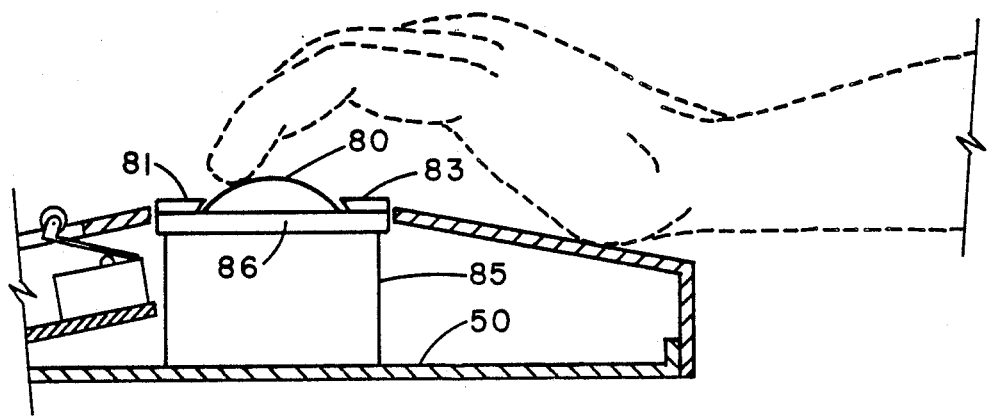
Figure 5:
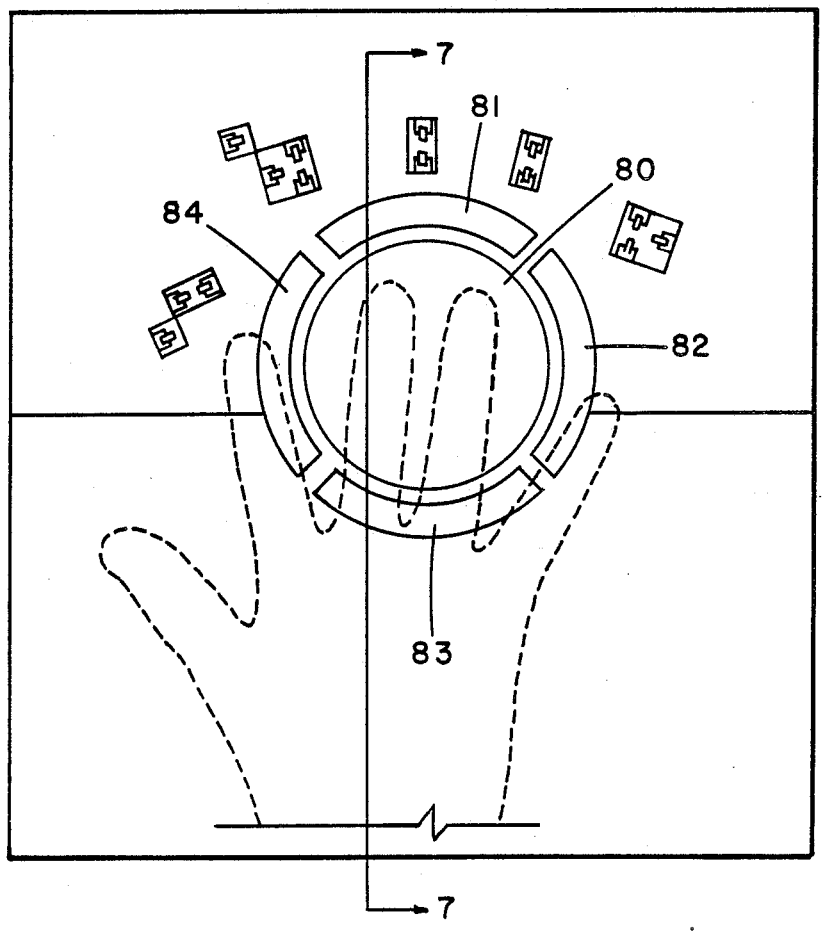

FIGS. 5 and 7 show an embodiment of the keyboard similar to FIG. 1, but having a separate cursor control. FIG. 5 shows only the right-hand section of the keyboard, and in most instances the separate cursor control would only be provided for one keyboard section. The section having the control could be either the right-hand section or the left-hand section, but could be provided for both sections depending upon the preference of the user. As shown in FIGS. 5 and 7, a cursor ball control 80 (such as a computer control commonly known as a track ball) with cursor button controls 81, 82, 83, and 84 are provided under the hand in normal position so that the fingers of the hand can be easily moved back from the home position keys to the cursor control ball and buttons. In such instance, depressing of the cursor control button will cause the cursor to move in the direction indicated by the position of the button and rolling the ball will cause the cursor to move in the same direction of movement. For example, depressing cursor button 81 will cause the cursor to move upwardly on the screen while depressing cursor button 83 will cause the cursor to move downwardly. Likewise, rolling the ball 80 toward button 81 will cause the cursor to move upwardly while rolling it toward button 83 will cause the cursor to move downwardly. Depressing button 82 or rolling ball 80 toward button 82 causes movement of the cursor toward the right and depressing button 84 or rolling ball 80 toward button 84 causes movement of the cursor toward the left. Ball 80 may be rotated at angles to the cursor buttons causing the cursor to move diagonally in the appropriate direction across the screen.

The cursor ball 80 is shown in FIG. 7 mounted in a housing 85 which is mounted on section bottom 50. The cursor buttons are mounted on a top portion 86 of the cursor ball housing 85. Various mounting arrangements for the cursor ball and buttons may be used and will be obvious to those skilled in the art.

It has been found that the keys arranged in closely spaced sets where a finger can rest on a set of keys to operate the keys either individually or in combination is very effective from the standpoint of rapid and accurate operation of the keys. Since the sets of keys are preferably located so that each finger tip and thumb tip of a hand of a user of the keyboard will, in home position, lightly rest on a set of keys, and because the size of the hand of various users of a keyboard may be different, in some instances it may be desirable to make the positioning of sets of keys adjustable so that they can be positioned for maximum comfort and efficiency for a particular user. This adjustment may be accomplished in a variety of ways, some of which may provide adjustability that is initially set for the hands of the expected usual user of the keyboard and is not easily readjusted for each short time user, and other ways which make the sets of keys easily adjustable at any time. While the keys of each set could be individually adjustable and while each set could be adjusted in various directions, it has been found that the keys can usually be satisfactorily adjusted in sets and that adjustment along the longitudinal axis of the particular finger or thumb concerned is satisfactory in most cases.

Figure 8:
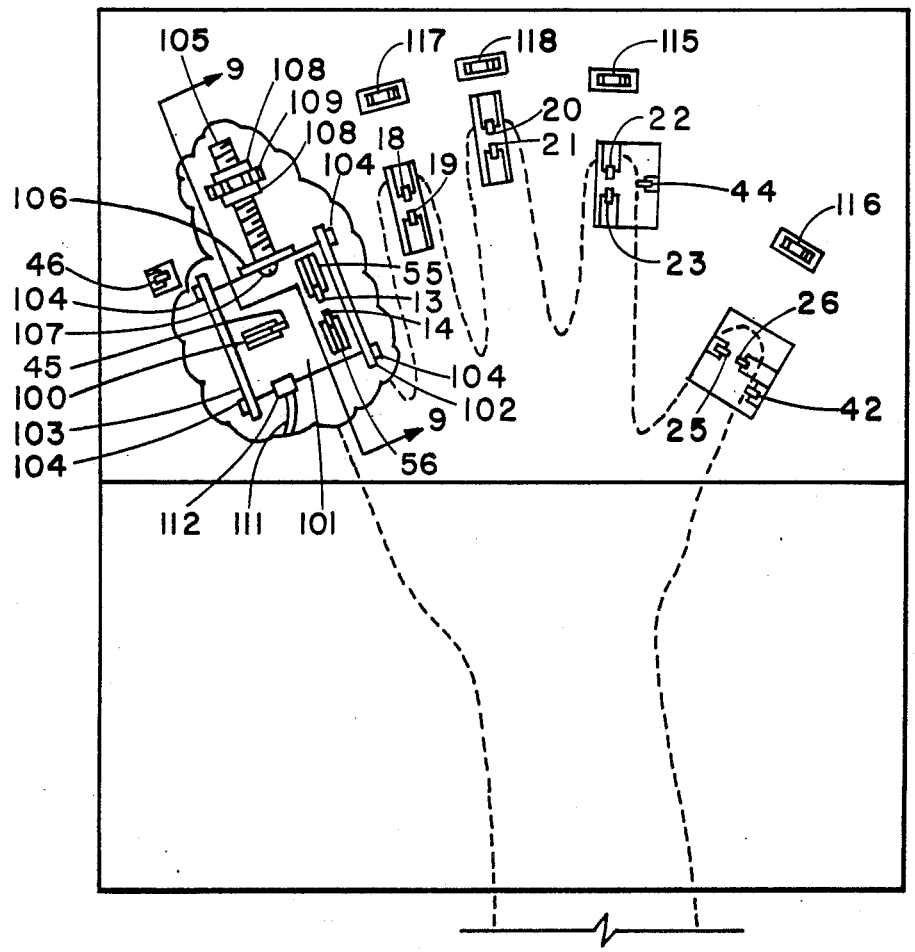
Figure 9:
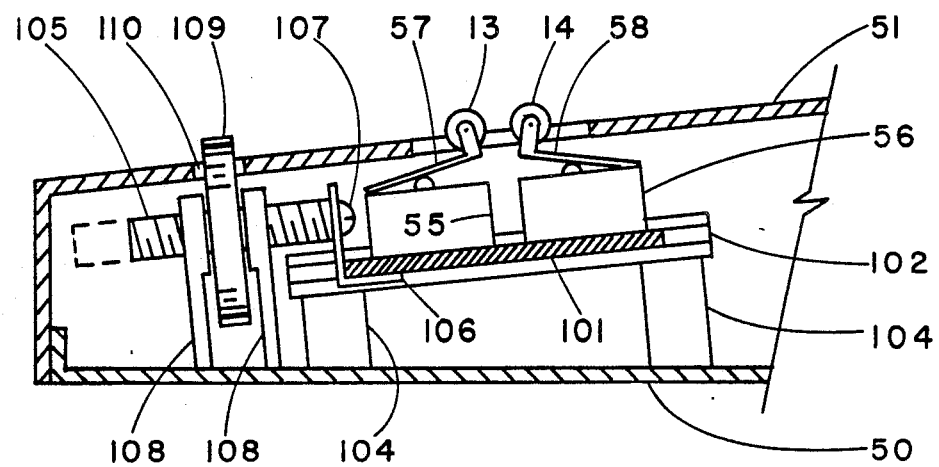

FIGS. 8 and 9 show the left hand section of an embodiment of the keyboard of FIG. 1 but having the sets of keys mounted so that each set may be individually and independently adjusted as to its position along the axis of the finger or thumb involved. As shown, the openings in the cover 51 of the keyboard through which the keys extend are more elongate than as shown in FIG. 1 so that the keys may move longitudinally therein.

With the embodiment shown, each set of keys, for example, keys 13 and 14 shown in the area with the cover broken away in FIG. 8, which are operably connected to switches 55 and 56 through arms 57 and 58, along with key 45 mounted on switch 100, are all mounted in fixed relation to one another on a mounting board 101. Mounting board 101 is positioned for back and forth sliding movement along the longitudinal axis of the finger in parallel channels 102 and 103 positioned along opposite edges of mounting board 101. The channels 102 and 103 are secured to base 50 in any suitable manner such as by mounting tabs 104 to which the channels may be glued or otherwise secured to the upper ends thereof.

A threaded rod 105 is secured to bracket 106 extending from mounting board 101, by screw 107 in a manner to prevent rotation of threaded rod 105. Supports 108, which may be molded into base 50 similarly to tabs 104, or otherwise secured to base 50, have openings therethrough through which threaded rod 105 extends. A thumb wheel 109 is threaded onto rod 105 and positioned between supports 108, with the upper portion of the thumb screw extending through opening 110 in cover 51.

To adjust the position of the set of keys, thumb wheel 109 is rotated. Since thumb wheel 109 is held against longitudinal movement by one or the other of supports 108, turning the thumb wheel causes longitudinal movement of threaded rod 105 and, since rod 105 is secured to mounting board 101, causes mounting board 101 to slide in channels 103 and 104. The direction of movement depends upon the direction of rotation of thumbwheel 109, rotating the wheel one direction causing longitudinal movement of the rod and mounting board in one direction and rotation of the thumbwheel 109 in the opposite direction causing longitudinal movement of the rod and mounting board in the other direction. In this way, the position of the keys can be easily adjusted to any desired position within the range of adjustment along the finger axis. Since in this embodiment each set of keys is mounted on a separate mounting board, wires 111 extend from a connector 112 on board 101 to the interface circuitry, not shown, so as to electrically connect the switches mounted on board 101 to the interface circuitry.

The other sets of keys are similarly mounted for adjustment in response to rotation of a thumb wheel with a separate thumb wheel being provided for each set of keys as shown in FIG. 8. As with keys 13 and 14 where the extra key 45 is adjusted along therewith, extra key 44 is adjusted along with set of keys 22 and 23 by rotation of thumb wheel 115 and key 42 is adjusted along with set of keys 25 and 26 by rotation of thumb wheel 116. Thumb wheels 117 and 118 adjust sets of keys 18 and 19, and 20 and 21, respectively. The extra key 46, which is used as a lock key, need not be adjustably mounted and is shown as fixed in FIG. 8.

While a specific embodiment is shown for adjustment of the keys, it should be realized that various means of adjustment could be used and that adjustment in various directions could be provided to allow the keyboard to be customized for any size hand.

As described herein, the keyboard of the ivnention has been directed to use as a data entry keyboard for entering letters, numbers, and symbols into a typewriter or computer as is current practice with currently available keyboards. However, keyboards of the invention can be used in any situation where a number of different inputs are needed consecutively for any purpose. For example, in control situations, the keyboard could be used to easily generate control signals such as to control an aircraft. In such instance a keyboard for one hand may be all that is necessary to generate the required control signals while leaving the other hand free to operate other types of controls. Also keys for each finger and thumb may not be necessary and the extra keys in addition to the home row keys may not be necessary.

Further, as indicated, the number of keys provided on the keyboard may vary depending upon the use of the board and the actual shape of the keyboard may also vary. Also, while two keys are currently preferred as the number of keys for each set, additional keys in each set could also be used. With separate left-hand and right-hand sections of the keyboard, material to be typed may be positioned between the sections so that the head does not have to be turned to look at the material and the separate units could be built into the arms of a special control chair, if desired, particularly if used for control purposes. The separate units, however, are not necessary and could be provided as a single keyboard unit.

While the keyboard has been described with the individual keys controlling electrical switches, the keys could control other means such as pneumatic switches or mechanical means to cause generation of desired data or operation of an item being controlled.

Whereas this invention is here illustrated and described with specific reference to an embodiment thereof presently contemplated as the best mode of carrying out such invention in actual practice, it is to be understood that various changes may be made in adapting the invention to different embodiments without departing from the broader inventive concepts disclosed herein and comprehended by the claims that follow.

I claim:

1. A keyboard for data entry or control, comprising a base; sets of two or more keys mounted on the base, each key including a roller having a superficial touch area with the superficial touch area for each roller of a set of keys being arranged for receiving the tip of a finger of a hand of an operator thereover and configured so that a fingertip of an operator may easily move thereover, the superficial touch areas of each set being sized and clustered together whereby substantially the entire superficial touch areas of a respective set of keys are substantially simultaneously comprehended by and selectively operable by a single finger tip of an operator; and means controlled by respective keys of the sets of keys.

2. A keyboard according to claim 1 wherein each set of keys comprises two keys, and either key of a set may be operated independently or both may be operated simultaneously.

3. A keyboard according to claim 2, wherein a set of keys is provided for each finger and thumb of each hand.

4. A keyboard according to claim 1, wherein the means controlled by the respective keys are switches, a separate switch being controlled by each key and wherein each roller is mounted on means coupling the roller to a switch.

5. A keyboard according to claim 4, wherein each switch is an electrical switch.

6. A keyboard according to claim 1, wherein there is additionally provided at least one key spaced from but sufficiently close to the keys of a set of keys as to be operable by a finger tip operating said set or the tip of a thumb operating said set.

7. A keyboard according to claim 1, wherein there is additionally provided at least one additional key located adjacent a set of keys so as to be operable by a finger tip operating said adjacent set of keys.

8. A keyboard according to claim 7, wherein there are provided a plurality of additional keys adjacent one or more sets of keys.

9. A keyboard according to claim 8, wherein sets of keys are provided for operation by at least the little finger of each hand, the index finger of each hand, and the thumb of each hand and wherein there are additional keys adjacent the sets of keys operated by the little finger of each and, the index finger of each hand, and the thumb of each hand.

10. A keyboard according to claim 9, wherein there are two additional keys adjacent the sets of keys operated by the little finger of the left hand and the index finger of the right hand, and one additional key adjacent the sets of keys operated by the index finger of the left hand, the little finger of the right hand, and the thumb of each hand.

11. A keyboard according to claim 9, wherein there are three additional keys located adjacent the sets of keys operated by the little finger and index finger of each hand and four additional keys located adjacent the sets of keys operated by the thumb of each hand.

12. A keyboard according to claim 9, wherein the keys of the sets of keys are adapted to produce normal data entry and control functions and the additional keys are adapted to operate as shift type keys.

13. A keyboard according to claim 1, additionally including means for adjusting the relative positioning of the respective sets of keys in relation to one another.

14. A keyboard according to claim 13, wherein the means for adjusting the relative position of the sets of keys adjusts each set of keys along the longitudinal axis of the respective finger operating the respective set of keys.

15. A keyboard according to claim 14, wherein each set of keys is mounted for longitudinal movement back-and-forth along the longitudinal axis of the respective finger operating the respective set of keys.

16. A keyboard according to claim 15, additionally including a separate mounting board mounting each set of keys, means mounting each mounting board for longitudinal movement back-and-forth along the longitudinal axis of the respective finger operating the respective set of keys, and means for controlling movement of the mounting board along such axis.

17. A keyboard according to claim 16, wherein the means for controlling movement of the mounting board includes a threaded shaft secured to said mounting board and extending from one end thereof in the direction of moveability; thumb wheel means threaded onto said shaft; and means restraining movement of said thumb wheel along said shaft so that when the thumb wheel is rotated, said shaft and mounting board move longitudinally along the axis of movement.

18. A keyboard for data entry or control, comprising a base; sets of two or more keys mounted on the base, each key having a superficial touch area with the superficial touch area for each key of a set of keys being arranged for receiving the tip of a finger of a hand of an operator thereover and being configured so that a fingertip of an operator may easily move thereover, the superficial touch areas of each set being sized and clustered together whereby substantially the entire superficial touch areas of a respective set of keys are substantially simultaneously comprehended by and selectively operable by a single finger tip of an operator; means for adjusting the relative positioning of the respective sets of keys in relation to one another; and means controlled by respective keys of the sets of keys.

19. A keyboard according to claim 18, wherein the means for adjusting the relative position of the sets of keys adjusts each set of keys along the longitudinal axis of the respective finger operating the respective set of keys.

20. A keyboard according to claim 19, wherein each set of keys is mounted for longitudinal movement back-and-forth along the longitudinal axis of the respective finger operating the respective set of keys.

21. A keyboard according to claim 20, additionally including a separate mounting board mounting each set of keys, means mounting each mounting board for longitudinal movement back-and-forth along the longitudinal axis of the respective finger operating the respective set of keys, and means for controlling movement of the mounting board along such axis.

22. A keyboard according to claim 21, wherein the means for controlling movement of the mounting board includes a threaded shaft secured to said mounting board and extending from one end thereof in the direction of moveability; thumb wheel means threaded onto said shaft; and means restraining movement of said thumb wheel along said shaft so that when the thumb wheel is rotated, said shaft and mounting board move longitudinally along the axis of movement.

* * * * *

UNITED STATES PATENT AND TRADEMARK OFFICE
CERTIFICATE OF CORRECTION

PATENT NO. : 4,897,649
DATED : January 30, 1990
INVENTOR(S) : Larry R. Stucki It is certified that error appears in the above-identified patent and that said Letters Patent is hereby corrected as shown below:

Title page, item (54), in the title:
"On" should be --Or--.
In other publications:
"Semi-Capacitive" should be --Semi-Captive--.
In the Specification:
In Column 2, Line 51, "∫" should be --"--.
In Column 9, Line 16, "maybe" should be --may be--; and Line 59, "nomore" should be --no more--.
In Column 7, Line 66, "″" should be --"--; and Line 67, "′" should be --'--.

Signed and Sealed this

Seventeenth Day of August, 1993

Attest:

BRUCE LEHMAN

*Attesting Officer*    *Commissioner of Patents and Trademarks*